(12) United States Patent
Fuderer

(10) Patent No.: US 10,379,184 B2
(45) Date of Patent: Aug. 13, 2019

(54) QUIET MR IMAGING

(71) Applicant: KONINKLIJKE PHILIPS N.V., Eindhoven (NL)

(72) Inventor: Miha Fuderer, Eindhoven (NL)

(73) Assignee: KONINKLIJKE, Eindhoven (NL)

( * ) Notice: Subject to any disclaimer, the term of this patent is extended or adjusted under 35 U.S.C. 154(b) by 89 days.

(21) Appl. No.: 15/534,021

(22) PCT Filed: Nov. 30, 2015

(86) PCT No.: PCT/EP2015/077994
§ 371 (c)(1),
(2) Date: Jun. 8, 2017

(87) PCT Pub. No.: WO2016/091623
PCT Pub. Date: Jun. 16, 2016

(65) Prior Publication Data
US 2018/0329008 A1    Nov. 15, 2018

(30) Foreign Application Priority Data

Dec. 12, 2014 (EP) .................................. 14197679

(51) Int. Cl.
*G01R 33/48* (2006.01)
*G01R 33/563* (2006.01)

(52) U.S. Cl.
CPC ..... *G01R 33/4826* (2013.01); *G01R 33/4816* (2013.01); *G01R 33/56341* (2013.01)

(58) Field of Classification Search
CPC ............ G01R 33/4826; G01R 33/4816; G01R 33/56341

(Continued)

(56) References Cited

U.S. PATENT DOCUMENTS 4,583,044 A * 4/1986 Case ................ G01R 33/56536
324/309
5,493,224 A * 2/1996 Shiono ............ G01R 33/56554
324/307

(Continued)

OTHER PUBLICATIONS

Weiger et al "ZTE Imaging in Humans" Magnetic Resonance in Medicine, vol. 70 p. 328-332 (2013).

(Continued)

*Primary Examiner* — Patrick Assouad
*Assistant Examiner* — Demetrius R Pretlow

(57) ABSTRACT

In a method of MR imaging with an MR device (1), an object (10) is positioned in an examination volume of the MR device (1). 'Silent' MR imaging with T2*-weighted or diffusion-weighted contrast is enabled. The method of subjecting the object (10) to an imaging sequence comprising: includes:
a) varying a magnetic field gradient vector (GX, GY, GZ) from an initial position (A) to an end position (B) over a plurality of intermediate positions while a number of RF pulses (20) is radiated in the presence of the magnetic field gradient;
b) varying the magnetic field gradient vector (GX, GY, GZ) again from the initial position (A) to the end position (B) over the plurality of intermediate positions while a number of MR echo signals is acquired in the presence of the magnetic field gradient;
c) sampling a spherical volume in k-space by repeating steps a) and b) a number of times for different initial, intermediate, and/or end positions; and
d) reconstructing a MR image from the acquired MR echo signals.

18 Claims, 3 Drawing Sheets

(58) Field of Classification Search
 USPC .......................................................... 324/307
 See application file for complete search history.

(56) References Cited

U.S. PATENT DOCUMENTS

| | | | |
|---|---|---|---|
| 5,537,039 A * | 7/1996 | Le Roux | G01R 33/4822 |
| | | | 324/307 |
| 5,570,018 A | 10/1996 | Halse | |
| 6,222,365 B1 | 4/2001 | Taniguchi et al. | |
| 2012/0074938 A1 | 3/2012 | Grodzki et al. | |
| 2014/0210471 A1 * | 7/2014 | Stemmer | G01R 33/56554 |
| | | | 324/309 |
| 2015/0115956 A1 | 4/2015 | Ackerman et al. | |
| 2016/0066874 A1 * | 3/2016 | Huang | A61B 6/5258 |
| | | | 600/411 |
| 2016/0266221 A1 * | 9/2016 | Hanada | G01R 33/561 |

OTHER PUBLICATIONS

Madio et al "Ultra-Fast Imaging Using Low Flip Angles and FIDs" Magnetic Resonance in Medicine 34 Oct. 1995, No. 4, p. 525-529.

* cited by examiner

QUIET MR IMAGING

CROSS REFERENCE TO RELATED APPLICATIONS

This application is a U.S. national phase application of International Application No. PCT/EP2015/077994, filed on Nov. 30, 2015, which claims the benefit of EP Application Serial No. 14197679.5 filed on Dec. 12, 2014 and is incorporated herein by reference.

FIELD OF THE INVENTION

The invention relates to the field of magnetic resonance (MR) imaging. It concerns a method of MR imaging. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field ($B_0$ field) whose direction at the same time defines an axis (normally the z-axis) of the co-ordinate system on which the measurement is based. The magnetic field produces different energy levels for the individual nuclear spins in dependence on the magnetic field strength. Transitions between these energy levels can be excited (spin resonance) by application of an electromagnetic alternating field (RF field, also referred to as $B_1$ field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse.

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of one or more receiving RF coils which are arranged and oriented within an examination volume of the MR device in such a manner that the variation of the magnetization is measured in the direction perpendicular to the z-axis.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The MR signal data obtained via the RF coils corresponds to the spatial frequency domain and is called k-space data. A set of k-space data is converted to a MR image by means of Fourier transformation or other appropriate reconstruction algorithms.

A significant level of acoustic noise occurs in conventional MR imaging sessions which is caused by mechanical oscillations of the magnetic field gradient coils placed in the static main magnetic field. The Lorentzian forces induced when an electrical current is applied to the gradient coils make them physically move. This displacement is dependent on the strength of the static magnetic field, the amplitude of the electrical current applied, and the frequency and waveform of the magnetic field gradient switching. The amplitude of the acoustic noise within the examination volume of a MR imaging device typically varies from 94 to 135 dB depending on various parameters: the hardware characteristics of the respective MR imaging device, the extent of vibration of the system, the type and the parameters (for example the repetition time) of the MR imaging sequence applied, the number of slices acquired, etc. The high level of acoustic noise induces stress and discomfort in the examined patients. Hearing protection is required to prevent hearing impairment.

The drawbacks of acoustic noise can be overcome by recently developed virtually silent MR imaging techniques, in which RF excitation as well as acquisition of MR signals are performed in the presence of a magnetic field gradient. The magnetic field gradient is applied for purely frequency-encoded, radial centre-out k-space encoding. In these known approaches, the spatially non-selective excitation must uniformly cover the full frequency bandwidth spanned by the readout magnetic field gradient, which is typically accomplished by radiating short, hard RF pulses. The acquisition of a free induction decay (FID) signal starts immediately after radiation of the RF pulse. After the FID readout, only minimal time is required for setting of the next readout magnetic field gradient before the next RF pulse can be applied, thus enabling very short repetition times (TR). The magnetic field gradient vector determining the readout direction is incrementally varied from repetition to repetition until a spherical volume in k-space is sampled to the required extent. Such radial centre-out k-space scanning techniques are sometimes referred to as "koosh ball"-scanning, with the radial k-space "spokes" and their arrangement in k-space resembling the filaments (strings) of the known toy ball design. Without the need for switching off the readout magnetic field gradient during the whole scan, MR imaging can be performed virtually silently (see, for example, Weiger et al, Magnetic Resonance in Medicine, vol. 70, p. 328-332, 2013). Further, the U.S. Pat. No. 5,570,018 mentions spatial encoding of magnetic resonance signal by way of sinusoidally varying magnetic gradient fields in two orthogonal directions (y and z) and using periods that differ by a factor of two.

Intrinsically, the known silent radial centre-out k-space encoding techniques deliver only a proton-density weighted contrast of the reconstructed MR image.

SUMMARY OF THE INVENTION

From the foregoing it is readily appreciated that there is a need for an improved method of MR imaging. It is an object of the invention to enable silent/quiet MR imaging with T2 (or T2*)-weighted or diffusion-weighted contrast.

In accordance with the invention, a method of MR imaging of an object positioned in the examination volume of a MR device is disclosed. The method of the invention comprises the steps of:

Exciting the magnetisation, using a succession of RF pulses, in the presence of a gradually changing magnetic field gradient;

Modifying the value of the gradient in such a way that, on a later point in time, a succession of echoes is formed corresponding to the aforementioned RF pulses.

In one embodiment of the invention (the 'Field Echo' embodiment), the method comprises following steps:

subjecting the object to an imaging sequence comprising:

a) gradually varying a magnetic field gradient vector from an initial position to an end position over a plurality of intermediate positions while a number of RF pulses is radiated in the presence of the magnetic field gradient;

b) gradually varying the magnetic field gradient vector again from the initial position to the end position over the plurality of intermediate positions while a number of MR echo signals is acquired in the presence of the magnetic field gradient;

c) sampling a spherical volume in k-space by repeating steps a) and b) a number of times for different initial, intermediate, and end positions;

reconstructing a magnetic resonance image from the acquired MR echo signals.

According to this embodiment, the magnetic field gradient is gradually changing direction (and optionally also strength) in step a). The vector of the magnetic field gradient starts at an initial position (determined by initial values of the magnetic field gradient strength and direction) and ends at an end position (determined by end values of the magnetic field gradient strength and direction) during each repetition of step a). Each position on the trajectory interconnecting the intermediate positions of the magnetic field gradient vector is passed twice according to the method of the invention, for a first time in step a) and for a second time in step b). The magnetic field gradient remains switched on throughout each of steps a) and b). Between steps a) and b), the magnetic field gradient vector should be varied back (without being switched off) from the end position to the initial position in such a fashion that the temporal integral of the magnetic field gradient ($0^{th}$ order moment) over the trajectory of steps a) and b), i.e. from the respective initial position to the respective end position and back to the initial position is (exactly) zero.

The time interval between steps a) and b) (the echo time) may be chosen in the range between 10 ms and 500 ms. During the first pass (step a), hard RF pulses are radiated, typically every 1-2 ms. During the second pass (step b), MR echo signals are acquired as radial k-space samples (without radiation of RF pulses) according to the momentary strength and direction of the magnetic field gradient. A full spherical volume of k-space is sampled by repeating steps a) through b), wherein the initial and end positions and/or the trajectories of the magnetic field gradient vector are varied from repetition to repetition. The MR image reconstructed finally from the acquired MR echo signals intrinsically delivers $T_2^*$-contrast. In a possible embodiment of the invention, the initial and end positions of the magnetic field gradient vector may be identical in one or more of the repetitions of steps a) and b).

The magnetic field gradient is preferably varied along a smooth trajectory. The magnetic field gradient frequencies required by the method of the invention are in the range from typically 10 Hz to 100 Hz, which limits acoustic noise as well as slew rate-demands on the hardware of the used MR device.

A diffusion-contrast MR image can be obtained by using different trajectories of the gradient magnetic field vector (resulting in different $1^{st}$-order moments seen by the acquired MR echo signals) and by calculating the corresponding diffusion-characteristics therefrom.

In a preferred embodiment of the invention, the magnetic field gradient vector is varied along identical trajectories in steps a) and b) such that well-defined radial k-space positions can be attributed to each of the acquired MR echo signals.

In a further preferred embodiment, the magnetic field gradient vector is varied along a closed circular trajectory centred at the origin of the magnetic field gradient coordinate system. This results in a simple and straight-forward implementation of the method of the invention. The temporal integral of the magnetic field gradient over the full circular trajectory is automatically zero (under the provision that the speed of the variation of the magnetic field gradient vector along the circular trajectory is constant). The full k-space volume can be sampled by choosing the meridians of the spherical k-space volumes as circular trajectories of the magnetic field gradient vector, wherein the azimuthal angle of the meridian is incremented from repetition to repetition of steps a) and b).

In an alternative embodiment (the "Spin Echo" embodiment), the method comprises following steps:

subjecting the object to an imaging sequence comprising:

a) gradually varying a magnetic field gradient vector from an initial position to an end position over a plurality of intermediate positions while a number of RF pulses is radiated in the presence of the magnetic field gradient;

b) varying the magnetic field vector towards zero;

c) applying a refocussing RF pulse;

d) varying the magnetic field vector towards the aforementioned end-position;

e) gradually varying the magnetic field gradient vector from the end position to the initial position, in reverse order over the plurality of intermediate positions, while a number of MR echo signals is acquired in the presence of the magnetic field gradient;

f) sampling a spherical volume in k-space by repeating steps a) thru e) a number of times for different initial, intermediate, and end positions;

reconstructing a magnetic resonance image from the acquired MR echo signals.

According to this embodiment, the magnetic field gradient is gradually changing direction (and optionally also strength) in step a). The vector of the magnetic field gradient starts at an initial position (determined by initial values of the magnetic field gradient strength and direction) and ends at an end position (determined by end values of the magnetic field gradient strength and direction) during each repetition of step a). Each position on the trajectory interconnecting the intermediate positions of the magnetic field gradient vector is passed twice according to the method of the invention, for a first time in step a) and for a second time, but in reversed order, in step e). The magnetic field gradient remains switched on throughout each of steps a) and e).

The time interval between steps a) and e) (the echo time) may be chosen in the range between 10 ms and 500 ms. During the first pass (step a), hard RF pulses are radiated, typically every 1-2 ms. During the second pass (step e), MR echo signals are acquired as radial k-space samples (without radiation of RF pulses) according to the momentary strength and direction of the magnetic field gradient. A full spherical volume of k-space is sampled by repeating steps a) through e), wherein the initial and end positions and/or the trajectories of the magnetic field gradient vector are varied from repetition to repetition. The MR image reconstructed finally from the acquired MR echo signals intrinsically delivers $T_2$-contrast. In a possible embodiment of the invention, the initial and end positions of the magnetic field gradient vector may be identical in one or more of the repetitions of steps a) through e).

The magnetic field gradient is preferably varied along a smooth trajectory. The magnetic field gradient frequencies required by the method of the invention are in the range from typically 10 Hz to 200 Hz, which limits acoustic noise as well as slew rate-demands on the hardware of the used MR device.

In an alternative embodiment, the magnetic field gradient vector is varied along a closed Tennis ball trajectory. A Tennis ball trajectory (resembling the curve of the typical seam of a Tennis ball) is understood as a curve that is defined by the intersection of a sphere and hyperbolic paraboloid. Again, considering the "Field Echo embodiment", the temporal integral of the magnetic field gradient over the full Tennis ball trajectory is automatically zero (under the provision that the speed of the variation of the magnetic field gradient vector along the trajectory is constant and that the Tennis ball trajectory is centred at the origin of the magnetic field gradient coordinate system). However, the length of the trajectory and thus the effective echo time of the acquired MR echo signals can be varied in a targeted fashion by appropriate selection of the parameters of the Tennis Ball curve. In this way it becomes possible, for example, to obtain a diffusion-contrast MR image. The SE embodiment includes an additional excursion to the position $G_{x,y}=0$.

According to yet another preferred embodiment of the invention, FID signals may be acquired in step i) after each RF pulse radiation in the presence of the magnetic field gradient, wherein a further MR image is reconstructed from the FID signals. In this way, two MR images can be obtained without requiring additional scan time, for example a $T_2^*$-contrast image (reconstructed from the MR echo signals) and a proton density-contrast image (reconstructed from the FID signals).

The method of the invention described thus far can be carried out by means of a MR device including at least one main magnet coil for generating a uniform steady magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, and a reconstruction unit. The method of the invention is preferably implemented by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
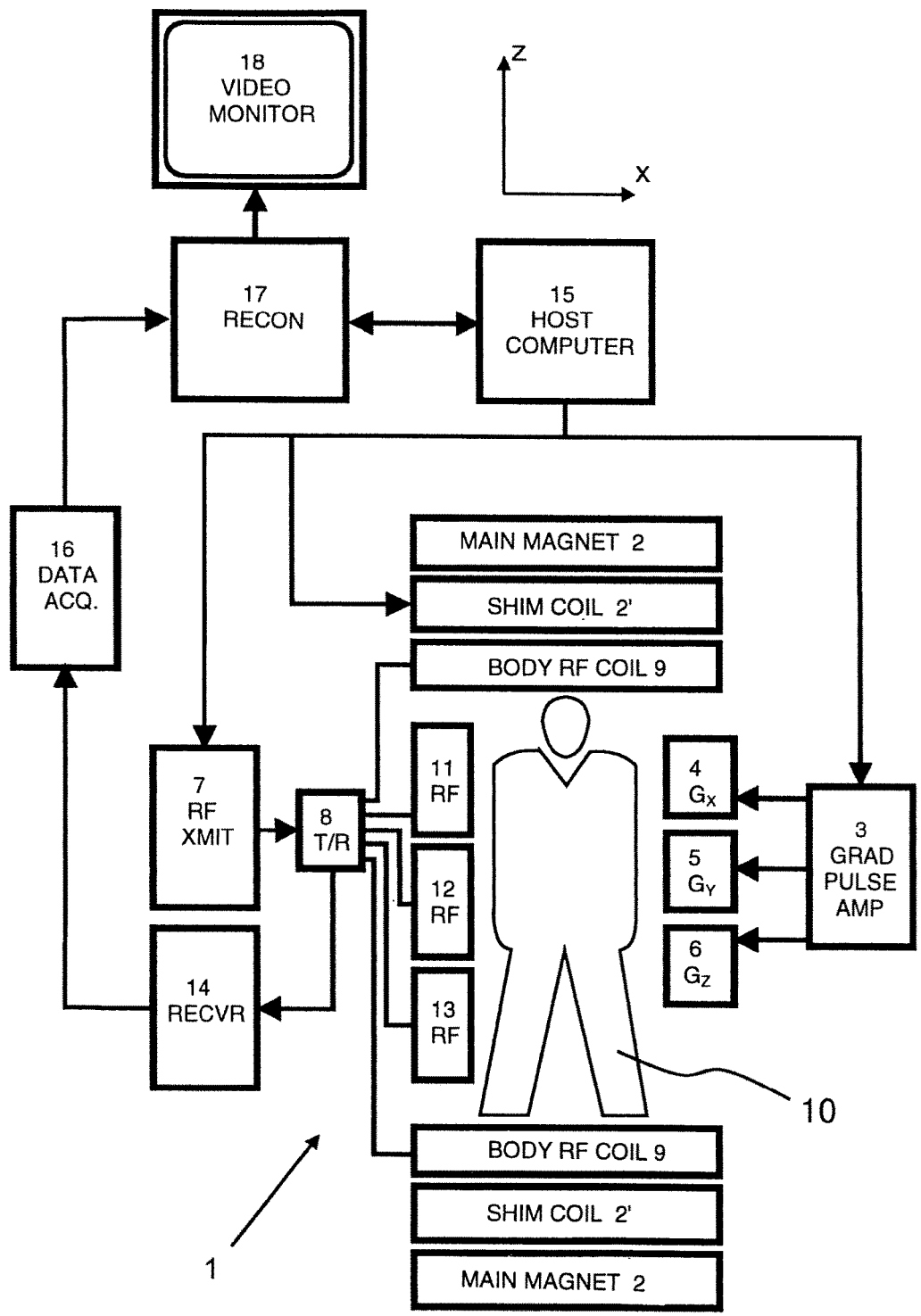
FIG. 1 schematically shows a MR device for carrying out the method of the invention.

With reference to FIG. 1, a MR device 1 which can be used for carrying out the method of the invention is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a body RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a pre-amplifier (not shown). The receiver 14 is connected to the RF coils 9, 11, 12 and 13 via send-/receive switch 8.

A host computer 15 controls the current flow through the shimming coils 2' as well as the gradient pulse amplifier 3 and the transmitter 7 to generate a MR imaging sequence according to the invention. The receiver 14 receives a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies an appropriate reconstruction algorithm. The MR image represents a three-dimensional volume. The image is then stored in an image memory where it may be accessed for converting projections or other portions of the image representation into appropriate format for visualization, for example via a video monitor 18 which provides a human-readable display of the resultant MR image.

Figure 2:
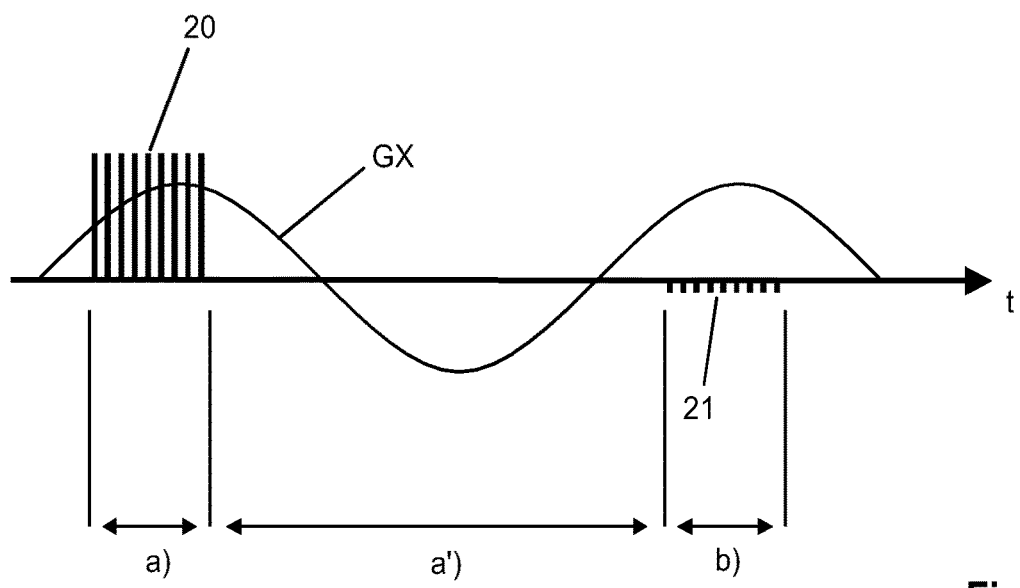
FIG. 2 shows a diagram illustrating the imaging sequence applied according to the invention.

FIG. 2 shows a diagram illustrating the MR imaging sequence applied according to the invention. The essence of the silent "koosh ball"-type scanning technique adopted by the invention is that excitation RF pulses 20 are transmitted simultaneously with the frequency-encoding readout magnetic field gradients GX, GY, GZ (from which only GX is shown in FIG. 2) being switched on. The readout magnetic field gradient GX is not intended as a slice-selection gradient which implies that the RF pulses 20 have to be short (typically 1 µs to 10 µs) in order to achieve sufficient excitation bandwidth.

The magnetic field gradient GX is varied gradually, i.e. continuously (e.g. sinusoidally) during step a) from an initial value to an end value while the RF pulses 20 are radiated in the presence of the magnetic field gradient. During step a'), the gradual variation of the magnetic field gradient GX continues while the magnetic field gradient GX varies from the end value back to the initial value in such a fashion that the temporal integral of the magnetic field gradient GX over the steps a) and a') is zero (which corresponds to one full oscillation period of the sinusoidal variation of GX). In step b), the gradual variation of GX continues wherein GX varies again from the initial value to the end value while a number of MR echo signal acquisitions 21 are performed in the presence of the magnetic field gradient GX.

A spherical volume in k-space is sampled by repeating steps a), a') and b) a number of times, wherein the gradient vector trajectory is varied accordingly from repetition to repetition. Finally, a $T_2^*$-contrast MR image is reconstructed from the acquired MR echo signals. The echo time corresponds to the duration of one oscillation period of the sinusoidal variation of GX in the depicted embodiment, which may be in the range between 10 and 500 ms, for example.

Figure 3:
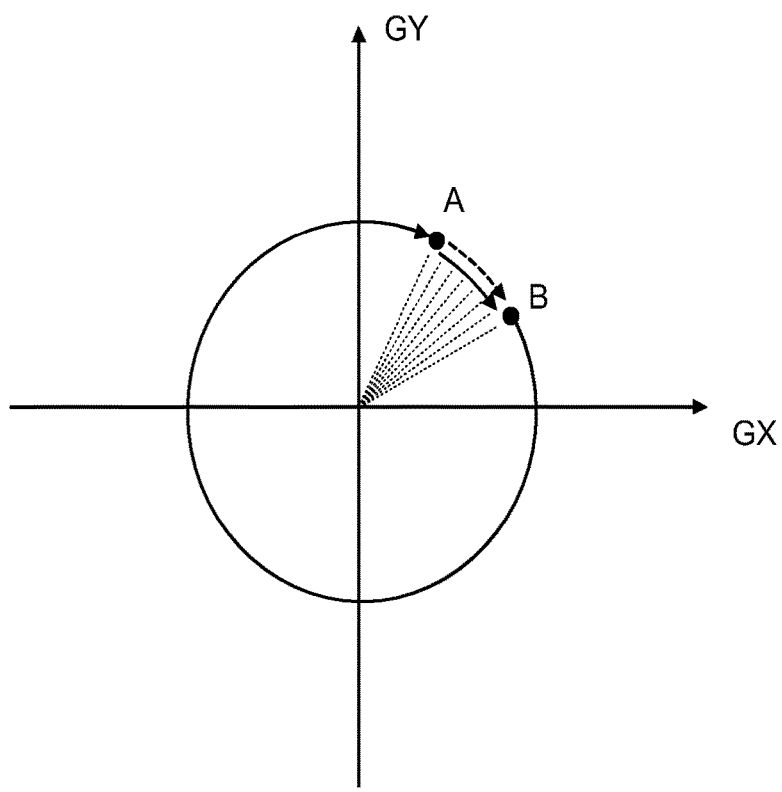
FIG. 3 shows a diagram schematically illustrating a possible trajectory of the magnetic field gradient vector according to the invention.

The basic idea of the invention is explained in the following in two dimensions with reference to FIG. 3 showing the magnetic field gradient coordinates GX and GY. The magnetic field gradient vector (determined by direction and strength of the magnetic field gradient) varies continuously from the initial position A to the end position B during step a) over a plurality of intermediate positions while the RF pulses 20 are applied as explained above with reference to FIG. 2. The solid arrow from position A to position B represents the trajectory of the magnetic field gradient vector during step a). The intermediate positions are located on this trajectory. In step a'), the magnetic field gradient vector is varied further along the circular trajectory 30. Since the trajectory from position A to position B and further from position B back to position A is centred at the origin, the temporal integral of the magnetic field vector (GX, GY) over the whole trajectory is zero. The magnetic field gradient vector follows exactly the same trajectory from position A to position B a second time in step b) (indicated by the dashed arrow in FIG. 3) such that a series of MR echoes emerges, each MR echo corresponding to one of the RF pulses 20. These MR echo signals are acquired along (very slightly curved) radial k-space "spokes" in step b), and the MR image is reconstructed therefrom. The radial k-space spokes are illustrated as dashed radial lines in the diagram of FIG. 3. The magnetic field gradient remains switched on at a constant strength while being varied continuously with respect to its direction throughout steps a) and b) in the depicted embodiment.

The trajectory of the magnetic field gradient vector in step a') may be chosen differently, for example for obtaining a particular echo time which is determined by the duration of step a'), as long as the temporal gradient integral over steps a) and a') is zero.

Typically, the variation of the magnetic field gradient over a full circular trajectory as shown in FIG. 3 may take 100 ms, with a repetition time of the RF pulses of 1 ms. This means that 100 k-space spokes would be acquired. Each of these k-space spokes is acquired 100 ms after the corresponding RF pulse, so the magnetization has experienced a $T_2^*$-decay. This results in a corresponding $T_2^*$-contrast MR image.

Figure 4:
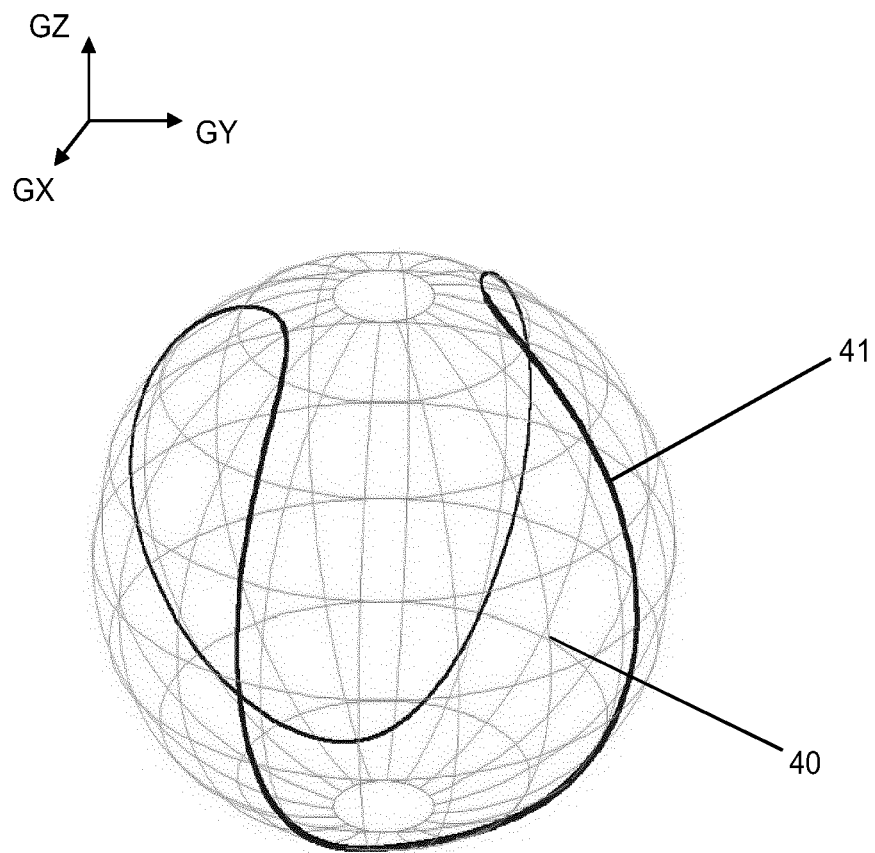
FIG. 4 shows a diagram illustrating possible trajectories of the magnetic field gradient vector to sample a three-dimensional spherical volume according to the invention.

FIG. 4 illustrates the extension of the principles of the invention to three dimensions. The circular trajectories of the gradient magnetic field vector (GX, GY, GZ) may be chosen as the meridians 40 of the shown spherical volume. After each circular double-round according to the invention, the azimuthal angle is slightly changed such that the next circular trajectory forms another meridian until the full spherical volume is covered by the corresponding k-space spokes.

However, as already mentioned, a different shape of the magnetic field gradient trajectories may be selected. Another conceivable trajectory is the Tennis ball trajectory 41 also shown in FIG. 4. The centre of the Tennis ball trajectory 41 coincides with the origin of the gradient coordinate system as well, such that the temporal integral of the magnetic field gradient vector over the full trajectory 41 is zero. The spherical volume may be covered by a series of different Tennis ball trajectories. The advantage of the Tennis ball trajectory 41 is that after one full trajectory the temporal integral of the magnetic field gradient ($0^{th}$ order moment) is zero, but the $1^{st}$ order moment differs between the Tennis ball trajectory 41 and the trajectory along the meridian 40. This will cause different sensitivities to motion and to diffusion. In order to obtain a diffusion-contrast MR image, for example, MR echo signals may thus be acquired along both trajectories 40 and 41, i.e. at two different values of the $1^{st}$ order moment of the magnetic field gradient trajectory.

Using the Tennis ball trajectory 41, macroscopic motion of the examined object 10 will cause phase-effects in the acquired MR echo signals varying from one trajectory to the next (with the trajectories being typically 100 ms distant in time). After k-space sampling along one Tennis ball trajectory 41, the centre of k-space is already sufficiently densely sampled to allow reconstruction of a low-resolution three-dimensional phase map. This phase map can be used as an intrinsic navigator which allows correction of motion-induced differences between successive Tennis ball trajectories. Motion artefacts can be avoided in this way.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A method of magnet resonance (MR) imaging of an object positioned in an examination volume of a MR device, the method comprising the steps of:
subjecting the object to an imaging sequence comprising:
a) varying a magnetic field gradient vector (GX, GY, GZ) from an initial position (A) to an end position (B) over a plurality of intermediate positions while a plurality of RF pulses are radiated in the presence of the magnetic field gradient;
b) varying the magnetic field gradient vector (GX, GY, GZ) again from the initial position (A) to the end position (B) over the plurality of intermediate positions while a plurality of MR echo signals are acquired in the presence of the magnetic field gradient;
c) sampling a spherical volume in k-space by repeating steps a) and b) a plurality of times for different initial, intermediate, and/or end positions;
reconstructing a MR image from the acquired MR echo signals.

2. The method of claim 1, wherein the magnetic field gradient vector (GX, GY, GZ) is varied along identical trajectories in steps a) and b).

3. The method of claim 1, wherein the magnetic field gradient remains switched on throughout the repetitions of steps a) and b).

4. The method of claim 1, wherein the magnetic field gradient vector is varied along a closed circular trajectory.

5. The method of claim 1, wherein the magnetic field gradient vector is varied along a closed Tennis Ball trajectory.

6. The method of claim 1, wherein the reconstructed MR image is a T2*-contrast or a diffusion-contrast image depending on different 1st-order gradient moments seen by the acquired MR echo signals.

7. The method of claim 1, wherein the time interval between the beginning of step a) and the beginning of step b) is in the range between 10 ms and 500 ms.

8. The method of claim 1, wherein the imaging sequence further comprises: varying the magnetic field gradient vector (GX, GY, GZ) from the end position (B) back to the initial position (A) after step a) and prior to step b), such that the temporal integral of the magnetic field gradient over the trajectory from the initial position (A) to the end position (B) and back to the initial position (A) is zero.

9. The method of claim 1 further comprising:
a) varying the magnetic field vector towards zero;
b) applying a refocusing RF pulse;
c) varying the magnetic field vector towards the aforementioned end-position;
d) wherein varying the magnetic field gradient vector from the end position to the initial position, is in reverse order over the plurality of intermediate positions, while the plurality of MR echo signals is acquired in the presence of the magnetic field gradient;
e) sampling a spherical volume in k-space by repeating steps a) thru e) a plurality of times for different initial, intermediate, and end positions.

10. The method of claim 1, wherein free induction decay (FID) signals are acquired after each RF pulse radiation in the presence of the magnetic field gradient, wherein a further MR image is reconstructed from the FID signals.

11. A magnetic resonance (MR) device comprising at least one main magnet coil for generating a uniform, steady magnetic field within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit, wherein the MR device is arranged to perform the following steps:
subjecting the object to an imaging sequence comprising:
a) varying a magnetic field gradient vector (GX, GY, GZ) from an initial position (A) to an end position (B) over a plurality of intermediate positions while a plurality of RF pulses is radiated in the presence of the magnetic field gradient;
b) varying the magnetic field gradient vector (GX, GY, GZ) again from the initial position (A) to the end position (B) over the plurality of intermediate positions while a plurality of MR echo signals is acquired in the presence of the magnetic field gradient;
c) sampling a spherical volume in k-space by repeating steps a) and b) a plurality of times for different initial, intermediate, and/or end positions;
reconstructing a MR image from the acquired MR echo signals.

12. A non-transitory computer-readable medium carrying a computer program configured to be run on a computer of a magnetic resonance (MR) device to control the MR device to:
generate an imaging sequence comprising:
a) varying a magnetic field gradient vector (GX, GY, GZ) from an initial position (A) to an end position (B) over a plurality of intermediate positions while a plurality of RF pulses are radiated in the presence of the magnetic field gradient;
b) varying the magnetic field gradient vector (GX, GY, GZ) again from the initial position (A) to the end position (B) over the plurality of intermediate positions while a plurality of MR echo signals are acquired in the presence of the magnetic field gradient;
c) sampling a spherical volume in k-space by repeating steps a) and b) a plurality of times for different initial, intermediate, and/or end positions;
reconstructing a MR image from the acquired MR echo signals.

13. The MR device of claim 11, wherein the magnetic field gradient vector (GX, GY, GZ) varies smoothly.

14. The MR device of claim 11, wherein the magnetic field gradient vector (GX, GY, GZ) varies continuously.

15. The MR device of claim 11, wherein the magnetic field gradient vector (GX, GY, GZ) varies sinusoidly.

16. The MR device of claim 11, wherein the magnetic field gradient vector (GX, GY, GZ) varies along a closed circular trajectory.

17. The MR device of claim 11, wherein the magnetic field gradient vector (GX, GY, GZ) varies along a closed Tennis ball trajectory.

18. The MR device of claim 11, wherein generating the imaging sequence further includes:
a) varying the magnetic field vector towards zero;
b) applying a refocusing RF pulse;
c) varying the magnetic field vector towards the aforementioned end-position;
d) wherein varying the magnetic field gradient vector from the end position to the initial position, is in reverse order over the plurality of intermediate positions, while the plurality of MR echo signals are acquired in the presence of the magnetic field gradient;

e) sampling a spherical volume in k-space by repeating steps a) thru e) a plurality of times for different initial, intermediate, and end positions.

* * * * *